(12) United States Patent
Gibson et al.

(10) Patent No.: US 6,641,712 B1
(45) Date of Patent: Nov. 4, 2003

(54) PROCESS FOR THE RECOVERY OF TIN, TIN ALLOYS OR LEAD ALLOYS FROM PRINTED CIRCUIT BOARDS

(75) Inventors: Robert William Gibson, Isle of Man (GB); Paul David Goodman, Surrey (GB); Lyn Holt, Oxfordshire (GB); Ian McCrady Dalrymple, Wrexham (GB); Derek John Fray, Cambridge (GB)

(73) Assignee: Alpha Fry Limited, London (GB)

( * ) Notice: Subject to any disclaimer, the term of this patent is extended or adjusted under 35 U.S.C. 154(b) by 0 days.

(21) Appl. No.: 09/889,980

(22) PCT Filed: Jan. 18, 2000

(86) PCT No.: PCT/GB00/00116
§ 371 (c)(1),
(2), (4) Date: Oct. 10, 2001

(87) PCT Pub. No.: WO00/43574
PCT Pub. Date: Jul. 27, 2000

(30) Foreign Application Priority Data

Jan. 25, 1999 (GB) .............................................. 9901586

(51) Int. Cl.$^7$ .............................. C25C 7/08; C25C 1/12; C25C 1/18; C25C 1/14
(52) U.S. Cl. ........................ 205/349; 205/580; 205/582; 205/599; 205/601; 205/611; 205/613; 205/614
(58) Field of Search ................................ 205/580, 597, 205/610–611, 599, 717, 719, 584, 363, 366, 349, 601, 723, 581–582, 613–614

(56) References Cited

U.S. PATENT DOCUMENTS 4,678,552 A * 7/1987 Chen .......................... 205/717
6,120,673 A * 9/2000 Reiter et al. ................ 205/611

* cited by examiner

*Primary Examiner*—Donald R. Valentine
(74) *Attorney, Agent, or Firm*—Mintz, Levin, Cohn, Ferris, Glovsky and Popeo, P.C.

(57) ABSTRACT

A method for selective dissolution of tin and/or lead- or tin-containing alloys from printed circuit boards is provided comprising contacting a printed circuit board with a solution comprising Ti(IV) and an acid which forms stable and soluble salt of Ti(III), Ti(IV), Sn(II) and Pb(II), under conditions to effect dissolution of substantially all of the Sn and/or Pb- or Sn-containing alloy therefrom, as Sn(II) and/or Pb(II) and recovering from the solution by electrolytic reduction substantially all of the Sn(II) and/or PB(II) species as Sn and/or Pb. After the electrolytic reduction step, the oxidant metal species is regenerated by oxidation and recycled to the first stage of the process.

21 Claims, No Drawings

PROCESS FOR THE RECOVERY OF TIN, TIN ALLOYS OR LEAD ALLOYS FROM PRINTED CIRCUIT BOARDS

RELATED PRIOR APPLICATIONS

This application claims priority under 35 U.S.C. §365(c) to International Application No. PCT/GB00/00116, filed on Jan. 18, 2000, which claims priority to British Application No. 9901586.9, filed on Jan. 25, 1999, both of which are incorporated herein by reference.

FIELD OF THE INVENTION

The invention relates generally to a method for recovery of tin, tin alloys or lead alloys, such as solder, from printed circuit boards.

BACKGROUND OF THE INVENTION

With the advent of more and more electronic hardware, there is more and more electronic scrap produced, including scrap printed circuit boards. Furthermore, there is a growing need for more environmentally friendly methods of recycling scrap printed circuit boards. Many current commercial processes focus only on recovering some of the component parts of printed circuit boards. For example, printed circuit boards are heated in furnaces to pyrolyze the organic compounds and melt the metals. The plastics and the electronic components are destroyed producing potentially harmful fumes and a remaining complex mixture of metals that then needs to be separated. An alternative process comprises the selective removal of the higher value components, such as gold edge connectors and microprocessor chips, and then scrapping the rest of the printed circuit board to, for instance, landfill.

It is more likely than not that legislation will be planned and enacted, particularly in the European Community, that will require manufacturers of electronic equipment to take back equipment at the end of its useful life for recycling. There is, therefore, a need for a method for treating printed circuit boards that can recover the majority of the cornconent parts of scrap printed circuit boards without the production of undesirable waste products.

During the manufacture of printed circuit boards, solder is applied at various stages for the purpose of bonding components to the exposed areas of metal using a wave soldering technique or using a solder paste. Furthermore, during the formation of lines and pads on printed circuit boards, a layer of tin or a tin-lead alloy, such as solder, may be deposited by circuit boards, a layer of tin or a tin-lead alloy, such as solder, may be deposited by electrodeposition, immersion plating or other processes onto selected areas of copper surfaces of circuit boards to define conductive tracks, pads, through holes, etc., and to act as an etch resist during subsequent etching array of the copper surfaces. Thus, in a method for recycling of scrap printed circuit boards the selective dissolution of the tin or tin-lead alloy used in the manufacture of the printed circuit boards from the copper substrate surface, without dissolving the copper, is an important first step.

European Patent No. EP-0508960 discloses a method of producing metallic lead from a material containing lead by dissolving the lead contained in the material and an electrolysis step for the cathodic deposition of the dissolved lead. The dissolving step is carried out with the use of an acid electrolyte in the presence of a redox couple. The method is used, in particular, for the production of lead from the active material of spent accumulators. Although this process discloses the dissolution of lead, a process for the selective dissolution of tin or tin-lead alloys is still desired.

A new selective dissolution process has now been developed in which the Plastics associated with electronic components are not attacked, the electronic components are not affected by the oxidant solution used in the process and the identification coding on the electronic components is unaffected. Thus, the components can be recovered for use. Furthermore, the oxidant solution, which is used to dissolve the tin or tin-lead alloy, is regenerated and recycled to the method, thereby avoiding the production of undesirable or unwanted waste products.

SUMMARY OF THE INVENTION

Embodiments of the invention provide a method for selective dissolution of tin and/or lead or tin-containing alloys from printed circuit boards without substantial dissolution of copper or precious metals and without attack on plastics associated with electronic components mounted to printed circuit boards, the method comprising steps of:

(i) providing a solution comprising Ti(IV) and an acid which forms stable and soluble salt of Ti(III), Ti(IV), Sn(II) and Pb (II);

(ii) contacting a printed circuit board with the solution under anaerobic conditions for a time sufficient to effect dissolution of substantially all of the Sn and/or Pb- or Sn-containing alloy therefrom, as Sn(II) and/or Pb(II);

(iii) subjecting the solution from step (ii) to electrolytic reduction in order to recover substantially all of the Sn(II) and/or Pb(II) species contained therein as Sn and/or Pb; and (iv) oxidizing the solution from step (iii) to regenerate the oxidant metal species and recycling the regenerated solution to step, (i) of the process.

By the term "soluble salt" as used herein is meant that the salt has a solubility of at least 1 gram per liter in the solution at the temperature at which the process is carried out.

For use in step (ii) of the method according to the invention, the oxidizing solution will preferably oxidize tin and lead metals, but will not dissolve copper. For this to be achieved the solution redox potential should be in the range of from +0.342 volts to +0.126 volts (standard hydrogen electrode), in terms of standard electrode potential, i.e. the interval between the anodic dissolution of copper and tin/lead.

The preferred solution for use in step (ii) of the method comprises an acid selected from the group consisting of fluoroboric acid, fluorosilicic acid, hexafluoro-phosphoric acid, hexafluoroantimonic acid and an alkylsulphonic acid. A solution comprising Ti(IV) and fluoroboric acid is particularly preferred. This solution may be prepared by dissolving Ti metal in fluoroboric acid with a sparge of oxygen gas or air. This solution has an unexpected selectivity for the dissolution of Sn and Pb over other metals, particularly copper.

In one embodiment of the method of the invention, other oxidant species/acids as defined in step (i) may also be used provided that, in use, the oxidant ions in solution have an oxidation potential which can selectively dissolve tin or a tin-lead alloy from the surface of the printed circuit board, but does not oxidize copper metal. Step (ii) of the method is carried out anaerobically, for example, by sparging the leach solution with an inert gas, such as nitrogen, during the leaching step.

The solution used in step (ii) of the method preferably comprises the oxidant metal species at a concentration generally in the range of from 0.01 M to 1.0 M metal ions, preferably 0.5 M to 0.9 M metal ion, and the acid at a concentration in the range of 10% to 100% by weight acid.

The temperature at which the solution used in step (ii) is contacted with the substrate surface is generally from 0° C. to 60° C., and preferably 20° C. to 30° C.

The method according to the invention may be used to dissolve tin or tin-lead alloys from printed circuit boards. Alloys which can be dissolved generally comprise from 5 to 99.5% by weight Sn, up to 95% by weight of Pb, and optionally up to 5% by weight of one or more of Ag, Bi, In, Zn, Cu or Sb. Solders commonly used in printed circuit board manufacture comprise 63% Sn, 37% Pb by weight, or 62% Sn, 36% Pb, 2% Ag by weight. Aluminium and any iron present in the printed circuit boards will dissolve in the acid leach and reduce the Ti(IV) oxidant to Ti(III), thus leaving less Ti(IV) available to react with the solder.

Accordingly, it is advantageous to remove these metals from the scrap printed circuit board prior to treatment with the leach solution. For example, physical separation methods may be used, such as by magnetic means for iron and using an eddy current separator for aluminium.

In step (iii) of the method of the invention, the electrolytic reduction of the solution containing the dissolved species is preferably carried out in a divided cell with inert electrodes, such as graphite anodes and stainless steel cathodes, and anolyte and catholyte compartments separated by a membrane, such as microporous or ion exchange material. The solution containing the dissolved species comprises the catholyte and the reaction at the cathode is the reduction of Sn(II) to Sn or the reduction of Sn(II) and Pb(II) to Sn and Pb, which are deposited on the cathode. When Pb and Sn are present together, for example as a solder alloy, they are then deposited together as an alloy, which can be re-used. The anolyte may comprise the same solution, or any other electrolyte of choice.

It is generally preferred for the catholyte solution to be isolated from the air since any oxygen present will oxidize Ti(III) in solution to Ti(IV), which in turn is reduced back to Ti(III) at the cathode. Furthermore, Sn(II) would be oxidized to Sn(IV) from which it is difficult to electrowin tin. Reduction of Ti(IV) to Ti(II) occurs at the expense of the metal plating reaction, leading to low metal yields and current efficiency.

The electrolytic reduction in step (iii) of the method of the invention is generally carried out at a current density in the range of from 50 A/m$^2$ to 500 A/m$^2$. The electrowinning of the tin and/or lead in step (iii) is carried out until substantially all of the metals are electrowin. The reason for this is that any Sn(II) present in the solution during step (iv) of the process would be oxidized to Sn(IV). In this form, it is very difficult to electrowin tin metal as normally the preferred cathodic reaction would be the evolution of hydrogen.

The oxidation in step (iv) of the method of the invention may be carried out by the electrolytic oxidation of the solution from step (iii). The oxidation of Ti(III) to Ti(IV) is preferably carried out in a divided cell with inert electrodes and anolyte and catholyte compartments divided by a membrane separator, such as a cation exchange membrane, for example Nafion. The oxidation of Ti(II) to Ti(IV) takes place at the anode with the solution from step (iii) forming the anolyte. The catholyte may comprise the same solution, or any other electrolyte of choice. The solution treated according to step (iv) is thus regenerated and then is recycled to step (i) of the process. Both steps can advantageously be carried out in the same cell. The leach solution loaded with Sn and Pb is first electrolyzed as the catholyte where SnPb is plated onto the cathode. The metal depleted solution can then become the anolyte where Ti(III) is oxidized to Ti(IV) at the anode after as much tin as possible has been electrowin as solder at the cathode. This is because if any tin is still present when the solution is oxidized either with air/oxygen or electrochemically, then the Sn(II) species is converted to Sn(IV) ions. In the Sn(IV) form it is difficult to convert into the metal for the reasons as discussed above. However, alternatively two divided cells can be used.

In one embodiment of the method of the invention, the oxidation may be carried out by contacting the solution with air or oxygen gas, for example, by sparging the solution with oxygen or preferably with air at high sparge rates. Alternatively oxygen gas can conveniently be generated electrolytically at the anode of the divided cell used for plating Sn/Pb. This requires no extra energy and so would be cheaper than using bottled oxygen gas.

As previously stated, the method of the invention is particularly applicable to the removal of tin, and/or alloys containing lead and/or tin, from printed circuit boards and the subsequent removal and recovery of electronic components, such as transistors, capacitors and resistors, from printed circuit boards after treatment in accordance with the method of the invention. This is an important feature and advantage of the method of the invention because the electronic components are recovered in a functional state.

In one embodiment, the method of the invention further comprises a step of contacting the desoldered, and optionally component-stripped, printed circuit board with a copper leaching solution suitable for dissolving Cu for a time sufficient to effect dissolution of substantially all of the Cu from the printed circuit board. The copper leaching solution may comprise, for example, copper (II) chloride, sodium chloride and hydrochloric acid or an ammonium salt, ammonia and, optionally, Cu(II) ions, such as, for example with ammonium sulphate/ammonia, which is most preferred. The copper leaching step will generally be carried out at a temperature in the range of from 30° C. to 60° C., and preferably from 45° C. to 55° C. In the case of Cu(II) chloride leaching optionally the Cu(II) species present in the resulting leaching solution at the end of the dissolution step may be electrolytically reduced to copper. Also, some of the Cu(I) can be oxidized anodically back to Cu(II), for further leaching, either in a divided cell or with hydrogen peroxide.

Furthermore, prior to the copper leaching step, the printed circuit board may be comminuted by one or more mechanical processing steps. This is important for multilayer printed circuit boards which contain thin layers of copper sandwiched between layers of plastic laminate. For the copper leach solution to gain access to this metal, the boards can be shredded or broken up in some way to create small pieces in which the maximum distance of any copper metal to an external edge is less than 10 mm, and preferably less than 5 mm. In one embodiment, additional process steps may be included to further recover valuable components from the scrap printed circuit boards. The components may be sorted in order according to value of component, value of contained element or toxicity of contained element, and the decoppered plastic laminate could be treated further to recover any bromine that may be present from flame retarding additives.

After the copper leaching step, the residues will still contain all of the precious metals (if present originally). The precious metals may be recovered by methods well known in the art, such as, for example, leaching with cyanide to recover gold, or leaching with chlorine, including, for example, chlorine generated electrochemically. All of the precious metals can thus be separated from the residual plastics and ceramic materials.

DETAILED DESCRIPTION OF THE INVENTION

Illustrative embodiments of the method according to the invention are described below in further detail with reference to Examples 1–3.

EXAMPLE 1

1. Solder Leaching

A solution of Ti(IV) in fluoroboric acid was prepared by dissolving titanium metal sponge (22.84 g) in 42% fluoroboric acid (1.6 l) over a period of 20 hours with a sparge of nitrogen gas. The solution so-formed contained 0.3M titanium as Ti(IV). The rates of dissolution of a 63% Sn, 37% Pb solder and copper were compared by the following procedure.

The metals in the form of cylinders (25 mm diameter) were encapsulated by epoxy resin to leave only one flat end exposed. The exposed ends were rotated in the leach solution to eliminate diffusion effects and with an oxygen sparge to reoxidize reduced titanium species back to Ti(TV). The rates of dissolution of solder (63% Sn, 37% Pb) and of copper in fresh leach solutions, maintained at 60° C., were compared by analysis of the metals content of the solution over six hours. The results are given below in Table 1.

TABLE 1

| Time (minutes) | Lead Dissolved from Solder (g/l) | Tin Dissolved from Solder (g/l) | Copper Dissolved (g/l) |
|---|---|---|---|
| 0 | 0 | 0 | 0 |
| 60 | 2.79 | 5.38 | 0.009 |
| 120 | 8.28 | 14.95 | 0.017 |
| 180 | 12.32 | 23.72 | 0.026 |
| 240 | 16.72 | 31.56 | 0.036 |
| 360 | 25.88 | 46.68 | 0.055 |

EXAMPLE 2

1. Solder Leaching

A leach solution was prepared with 7.2 g titanium metal dissolved in 1.5 l concentrated fluoroboric acid (42%). This was then air sparged to oxidize the Ti ions to Ti(IV). Whole and segmented printed circuit boards were placed in this solution, which was sparged with nitrogen at 4 l/min. When all of the solder had dissolved from boards, they were removed and replaced with new ones. Table 2 below shows the build up of tin and lead in solution, as well as the concentration of iron and copper impurities.

TABLE 2

| Time (hours) | Pb(g/l) | Sn(g/l) | Fe(g/l) | Cu(g/l) |
|---|---|---|---|---|
| 0 | 0 | 0 | 0 | 0 |
| 4.25 | 3.9 | 7.5 | 0 | 0 |
| 8 | 6.0 | 10.8 | 0.02 | 0.01 |
| 12 | 9.8 | 16.1 | 0.05 | 0.02 |
| 16.25 | 14.2 | 25.3 | 0.14 | 0.01 |
| 20.25 | 18.2 | 31.9 | 0.21 | 0.03 |
| 24.5 | 20.2 | 35.1 | 0.41 | 0.01 |
| 30.5 | 25.7 | 43.0 | 0.58 | 0 |

2. Solder Electrowinning and Regeneration of Leach Solution

Tin and lead were recovered by electrowinning these metals from the fluoroborate solution.

The Ti(III) containing solution from step (i) above was regenerated by electrolysis. The anodic process was the oxidation of Ti(III) to Ti(IV) in order to regenerate active leachant for further leaching operations.

The electrolytic cell was constructed from PVC and consisted of separate anolyte and catholyte chambers divided by a membrane separator (cation selective ion exchange membrane). A graphite anode was placed in the anolyte compartment with a 316 stainless steel cathode in the catholyte compartment. The dimensions of each electrode were 90 mm×100 mm. The electrolysis was carried out with separate anolyte and catholyte solutions (each 1.0 liter), which was recirculated continuously from external tanks at flow rates of 60 l/h and 10 l/h, respectively. The low catholyte flow rate was chosen in order to minimize contact with air.

The catholyte solution consisted of 75% v/v of 40% w/w fluoroboric acid containing 0.1M titanium ions. The initial concentration of Sn was 38 g/l and the initial concentration of Pb was 32 g/l. The cell was operated at a current of 1.8A (200 Am$^2$) for a total of 11 hours. At the end of this time, the metal ion concentrations were reduced to 26 g/l Sn and 35 ppm Pb. The total weight of recovered metal was 28 g. The redox potential of the solution changed from −200 mV to −220 mV. The total current efficiency for Sn and Pb deposition was 83%.

During the electrolysis the redox value of the anolyte changed from −190 mV to +445 mV, which corresponds to the regeneration of the leachant with the Ti ion content converted to the higher (IV) oxidation state. The concentrations of Sn and Pb in this example of regenerated leachant were 2.6 g/l and 3.0 g/l, respectively.

The regenerated leachant was then used to dissolve further solder. The solution was divided into two equal portions of 370 ml. In one portion, a piece of scrap circuit board (area 50 mm×90 mm) with attached electrical components was immersed and rotated at approximately 250 rpm. After 8 hours at room temperature, 1.3 g of solder had been leached from the board and the components had either fallen off or could be removed easily by light brushing. The redox potential of the solution had fallen to −188 mV. The second sample was used to leach solder wire. After 18 hours the tin and lead concentrations had increased to 15.4 g and 9.6 g, respectively, with redox level of −214 mV. When leaching was continued for an additional 4 hours, the tin concentration only increased slightly to 16.1 g, and there was no further increase in the Pb concentration. The final redox potential was −246 mV.

3. Recovery of Components

Printed circuit boards were removed from a variety of pieces of electronic equipment, including an IBM personal computer, and treated with the solder leach solution, as described above. Most of the components were of the surface mount type and either dropped off or were removed by brushing the surface. Some components (chip capacitors and resistors) mounted on the underside were attached with adhesive as well as being soldered. After leaching, these components could be removed with minimal force.

The functionality of removed components was demonstrated with a 80486DX integrated circuit. After immersion in the sparged leach solution described above for three hours at 20° C., the functionality was tested by Intex Computers Ltd. and was found to have been unaffected.

4. Copper Leaching

A. A copper leaching solution was prepared from 0.3M copper (II) chloride, 4M sodium chloride and 0.4 M hydrochloric acid. 500 cm$^3$ of solution at 60° C. was used to leach 100.25 grams of desoldered printed circuit board with the components removed, as described above. The boards were shredded so that 80% of the pieces were less than 6 mm and 75% were greater than 2 mm. The boards were leached in the stirred solution for 4 hours. The copper concentration in the solution increased from 19 g Cu/l to 52.5 g Cu/l, which is suitable for electrowinning. The copper dissolved accounts for over 90% of the theoretical quantity of copper available and very little metal was visible attached to the laminate after the leaching step.

B. A leach solution was prepared containing 1.5M ammonium sulphate, 2M ammonia and 1 g copper/liter. 500 cm$^3$ of this solution was heated to 50° C. and stirred with 100 g of printed circuit board that had previously been desoldered, depopulated and shredded (as described above). The mixture was sparged with oxygen gas (up to 0.5 l/mm). After 180 minutes, almost no copper metal was visible in the remaining plastic laminate and the solution contained 25 g Cu/l. The small amount of gold that was present, however, was not dissolved.

EXAMPLE 3

Printed circuit boards were shredded to give a product with particles all less than about 12 mm. Magnetic material and aluminium were removed by Eriez Magrietics Ltd. (Bedws, South Wales) using an eddy current separator. This gave a product with reduced iron and aluminium contents.

|  | Before Separation | After Separation |
|---|---|---|
| Iron | 8.05% | 0.04% |
| Aluminium | 0.88% | 0.18% |

A solder leach solution (500 cc) was prepared by dissolving 18 grams of titanium sponge in 500 cc of 30% fluoroboric acid. When this solution had cooled, oxygen was sparged into it until the color changed from green, through brown to colorless. 260 grams of eddy current treated printed circuit board scrap was added to the 500 cc of leach solution and nitrogen was sparged through it to stir the mixture and to prevent oxidation by air of either any Ti(III) or Sn(II) in solution. Samples were taken periodically to monitor the progress of the reaction. The reaction was complete after 4 hours. Tin and lead concentrations were measured during the reaction.

| Reaction Time (minutes) | Tin Concentration (g/l) | Lead Concentration (g/l) |
|---|---|---|
| 30 | 17.3 | 9.1 |
| 60 | 22.2 | 12.0 |
| 120 | 24.6 | 14.3 |
| 240 | 27.8 | 16.5 |

After 4 hours, most of the solder had dissolved and most of the Ti(IV) oxidant had been reduced to Ti(III).

A typical solution obtained by anaerobic leaching of printed circuit board scrap was used for electrowinning of the solder metal. This was carried out in a glass divided cell with a cathode current density of about 200 Am$^{-2}$ for 6 hours. The catholyte was sparged with argon to prevent the formation of Sn(IV) and to stir the solution. The tin concentration dropped from 16 g/l to 0.16 g/l after 6 hours, and the lead concentration dropped from 12 g/l to 0.064 g/l after 6 hours. The total current efficiency for electrowinning of solder was 100%. The remaining catholyte was sparged with oxygen to regenerate the Ti(IV) for re-use.

After carrying out this process, the de-soldered printed circuit board can be leached to dissolve copper according to the method in Example 2, process B, as described above.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A method for selective dissolution of tin and/or lead- or tin-containing alloys from printed circuit boards without substantial dissolution of copper or precious metals and without attack on plastics associated with electronic components mounted to printed circuit boards, the method comprising steps of:
   (i) providing a solution comprising Ti(IV) and an acid which forms stable and soluble salt of Ti(III), Ti(IV), Sn(II) and Pb(II);
   (ii) contacting a printed circuit board with the solution under anaerobic conditions for a time sufficient to effect dissolution of substantially all of the Sn and/or Pb- or Sn-containing alloy therefrom, as Sn(II) and/or Pb(II);
   (iii) subjecting the solution from step (ii) to electrolytic reduction in order to recover substantially all of the Sn(II) and/or Pb(II) species contained therein as Sn and/or Pb; and
   (iv) oxidizing the solution from step (iii) to regenerate the oxidant metal species and recycling the regenerated solution to step (i) of the process.

2. The method of claim 1, wherein the solution of step (i) includes an acid selected from the group consisting of fluoroboric acid, fluorosilicic acid, hexafluorophosphoric acid, hexafluoroantimonic acid and an alkylsulphonic acid.

3. The method of claim 2, wherein the solution of step (i) is prepared by dissolving Ti metal in fluoroboric acid with a sparge of oxygen gas or air.

4. The method of claim 1, wherein the pH of the solution of step (i) is less than pH 1.0.

5. The method of claim 1, wherein the solution of step (i) includes the oxidant metal species in a range of from 0.01 M to 1.0 M, and the acid in a range of from 10% to 100% by weight.

6. The method of claim 1, wherein step (ii) is carried out at a temperature in the range of from 20° C. to 60° C.

7. The method of claim 1, wherein the alloy comprises Sn in an amount of from about 5% to about 99.5% by weight, Pb in an amount of up to about 95% by weight, and, optionally, up to about 5% by weight of one of the elements selected from the group consisting of Ag, Bi, In, Zn, Cu and Sb and combinations thereof.

8. The method of any one of the preceding claims, wherein the electrolytic reduction in step (iii) is carried out in a divided cell including inert electrodes and a cation exchange membrane.

9. The method of claim 8, wherein the catholyte is isolated from the air.

10. The method of claim 7, wherein the electrolytic reduction of step (iii) is carried out at a current density in the range of from about 50 A/m$^2$ to about 500 A/m$^2$.

11. The method of claim 1, wherein the oxidation of step (iv) is an electrolytic oxidation and is carried out in a divided cell including inert electrodes and a suitable cell separator.

12. The method of claim 1, further comprising recovering electronic components, such as transistors, capacitors and resistors, from the printed circuit board after step (ii).

13. The method of claim 12, further comprising contacting the desoldered and optionally, component-stripped printed circuit board with a copper leaching solution suitable for dissolving Cu for a time sufficient to effect dissolution of Cu from the printed circuit board.

14. The method of claim 13, wherein the copper leaching solution suitable for dissolving Cu includes copper(II) chloride, sodium chloride and hydrochloric acid.

15. The method of claim 13, wherein the copper leaching solution suitable for dissolving Cu includes an ammonium salt, Cu(II) ions and ammonia.

16. The method of claim 13, wherein contacting the printed circuit board with the copper leaching solution occurs at a temperature of from 20° C. to 60° C.

17. The method of claim 13, further comprising electrolytic reduction of the Cu(II) species present in the resultant solution to provide Cu.

18. The method of claim 13, wherein the printed circuit board includes a plastic laminate and the method further comprises treating the printed circuit board to recover any bromine that may be present in the flame retardant additives used in the manufacture of the plastics material.

19. The method of claim 12, wherein the printed circuit board is subjected to mechanical processing prior to step (ii) to decrease a bulk thereof and to increase the accessibility of copper to the leach solution.

20. The method of claim 12, wherein the electronic components are recovered in a functional state.

21. The method of claim 12, wherein the electronic components are sorted accordinga value to selected from the group consisting of a value of the components, a value of elements contained therein and a value of toxicity of elements contained therein.

* * * * *

UNITED STATES PATENT AND TRADEMARK OFFICE
CERTIFICATE OF CORRECTION

PATENT NO.     : 6,641,712 B1
DATED          : November 4, 2003
INVENTOR(S)    : Gibson et al.

It is certified that error appears in the above-identified patent and that said Letters Patent is hereby corrected as shown below:

<u>Column 10,</u>
Line 19, delete "accordinga" and insert -- according to a --.
Line 19, delete "to selected" and insert -- to be selected --.

Signed and Sealed this

Second Day of March, 2004

JON W. DUDAS
*Acting Director of the United States Patent and Trademark Office*